(12) United States Patent  
Eberler et al.

(10) Patent No.: US 6,232,548 B1
(45) Date of Patent: May 15, 2001

(54) RADIO-FREQUENCY SHIELD FOR A DIAGNOSTIC MAGNETIC RESONANCE APPARATUS

(75) Inventors: Ludwig Eberler, Postbauer-Heng; Juergen Nistler, Erlangen, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/401,447

(22) Filed: Sep. 22, 1999

(30) Foreign Application Priority Data

Sep. 24, 1998 (DE) .................................. 198 43 905

(51) Int. Cl.⁷ .......................... H05K 9/00; H01B 7/34
(52) U.S. Cl. ........................ 174/35 R; 174/36; 333/222
(58) Field of Search .............................. 174/35 R, 36; 333/222, 243; 324/300, 303, 318, 322

(56) References Cited

U.S. PATENT DOCUMENTS 5,247,270 * 9/1993 Harman et al. .................. 174/36 X
5,574,372   11/1996 Moritz et al. .
5,680,046   10/1997 Frederick et al. .

* cited by examiner

Primary Examiner—Jessica Han
(74) Attorney, Agent, or Firm—Schiff Hardin & Waite

(57) ABSTRACT

A radio-frequency shield for a diagnostic magnetic resonance apparatus has a hollow-cylindrical carrier composed of a dielectric, a first electrically conductive coating arranged at an inside of the carrier and provided with axially aligned separating slots, and A second electrically conductive coating arranged at an outside of the carrier and provided with axially aligned separating slots. The separating slots in the first and second coatings, respectively, are offset relative to one another in a circumferential direction. The first coating has slotted end regions at the ends of the carrier and at least one slofted middle region between the end regions. The separating slots arranged in the end regions are transverse slots that are arranged at axially inwardly disposed ends of the separating slots.

4 Claims, 3 Drawing Sheets

RADIO-FREQUENCY SHIELD FOR A DIAGNOSTIC MAGNETIC RESONANCE APPARATUS

BACKGROUND OF THE INVENTION

1. Field of the Invention

The present invention is directed to a radio-frequency shield for a diagnostic magnetic resonance apparatus, the shield being of the type having a hollow-cylindrical carrier composed of a dielectric, having a first, electrically conductive coating arranged at an inside of the carrier and provided with axially aligned separating slots, a second electrically conductive coating at an exterior of the carrier and provided with axially aligned separating slots, with the separating slots in the first coating and in the second coating being offset relative to one another in a circumferential direction, and wherein the first coating has slotted end regions at the ends of the carrying member and at least one slotted middle region between the end regions.

2. Description of the Prior Art

A radio-frequency shield of this type is disclosed in U.S. Pat. No. 5,574,372. The radio frequency shield is arranged between a gradient coil system and a whole body radio-frequency antenna. Its function is to shield the radio-frequency field of the whole body radio-frequency antenna from the exterior and to keep disturbances originating from the exterior out of the imaging region of the magnetic resonance apparatus. A completely closed, conductive envelope would in fact be optimum for the radio-frequency shielding effect, but is unusable because the radio-frequency shield must be transmissive for the low-frequency gradient fields on the order of magnitude of up to 20 kHz. In order for the low-frequency gradient fields to be built up substantially undistorted in the imaging volume, it is necessary to substantially suppress eddy currents induced by the fields in the radio-frequency shield. To that end, the conductive layer acting as radio-frequency shield is slotted in the longitudinal direction, i.e., in a principal direction of the mirror currents generated by the antenna in the radio-frequency shield. The leaks in the radio-frequency shield which arise due to the slots are shielded by a second conductive layer wherein the separating slots are arranged offset in the circumferential direction from the slots in the first coating. The two layers or coatings are applied on opposite sides of a tubular carrier composed of a dielectric material. Radio-frequency currents can flow across the slots due to the capacitive coupling. Since the gradient coils extend beyond the exterior dimensions of the whole body antenna in the axial direction, the longitudinal dimensions of the radio-frequency shield are also basically adapted to those of the gradient coils. The design of the separating slots is essentially dependent on whether a linearly or a circularly polarizing whole body antenna is to be shielded. A disadvantage, however, is that local heating can occur in the radio-frequency shield, particularly given rapid imaging or given high gradient field strengths.

Another possibility for the design of the radio-frequency shield is disclosed in U.S. Pat. No. 5,680,046. C-shaped structures are applied double-sided on a carrier in order to simulate the radio-frequency mirror current paths as exactly as possible. A good radio-frequency shielding with a simultaneously good suppression of the eddy currents thus is achieved. A disadvantage, however, is that the shielding effect is only effective for a specific radio-frequency antenna. Thus, the shield design must be implemented differently when a circularly polarizing antenna is to be shielded instead of a linearly polarizing antenna.

SUMMARY OF THE INVENTION

An object of the present invention is to provide a radio-frequency shield for a diagnostic magnetic resonance apparatus, wherein the shielding effect is largely independent of whether a linearly or a circularly polarizing whole body antenna is to be shielded, and wherein local heating due to increased eddy current densities is largely reduced in the radio-frequency shield.

This object is achieved in accordance with the principles of the present invention in a radio-frequency shield of the type initially described, having the additional feature of separating slots introduced into the end regions being transverse slots that are arranged at the axially inwardly disposed end of the separating slots. The separating slots extending essentially only in the axial direction and the capacitive coupling of the micro-strips separated by the separating slots relative to one another causes the shielding effect to remain constantly good regardless of the type of radio-frequency antenna utilized. As a result of the transverse slots, eddy currents flowing in the circumferential direction can no longer penetrate as far into the edge-side micro-strips. The flow field becomes more uniform. Local increases of the eddy current density at the end of the outer longitudinal slots, and thus local heating are greatly reduced.

In an embodiment, the inner coating has a continuous separating slot in the middle proceeding in the circumferential direction that is bridged with a resistor. Due to the interruption in the middle of the shield, eddy currents that are induced by a gradient (z-gradient) rising in the axial direction cannot flow. The interruption does not represent a resistance for the radio-frequency currents since both shield halves are connected to the shield structure at the exterior via a capacitive coupling. Static charges of the two shield halves that could lead to partial discharges (spikes) are dismantled by the resistor.

In another embodiment, the spacing of the separating slots from one another in the circumferential direction is lower in the end regions than a corresponding spacing of the separating slots in the middle region. At the expense of the capacitive coupling between neighboring micro-strips, the eddy currents induced by the gradient fields are reduced in this area. Since, however, the mirror currents induced by the radio-frequency antenna in the end regions of the radio-frequency shield are significantly lower in the middle region because of the greater distance of the antenna, the capacitive coupling between neighboring micro-strips can also be reduced in order to farther reduce the eddy currents in this region.

DESCRIPTION OF THE PREFERRED EMBODIMENTS

Figure 1:
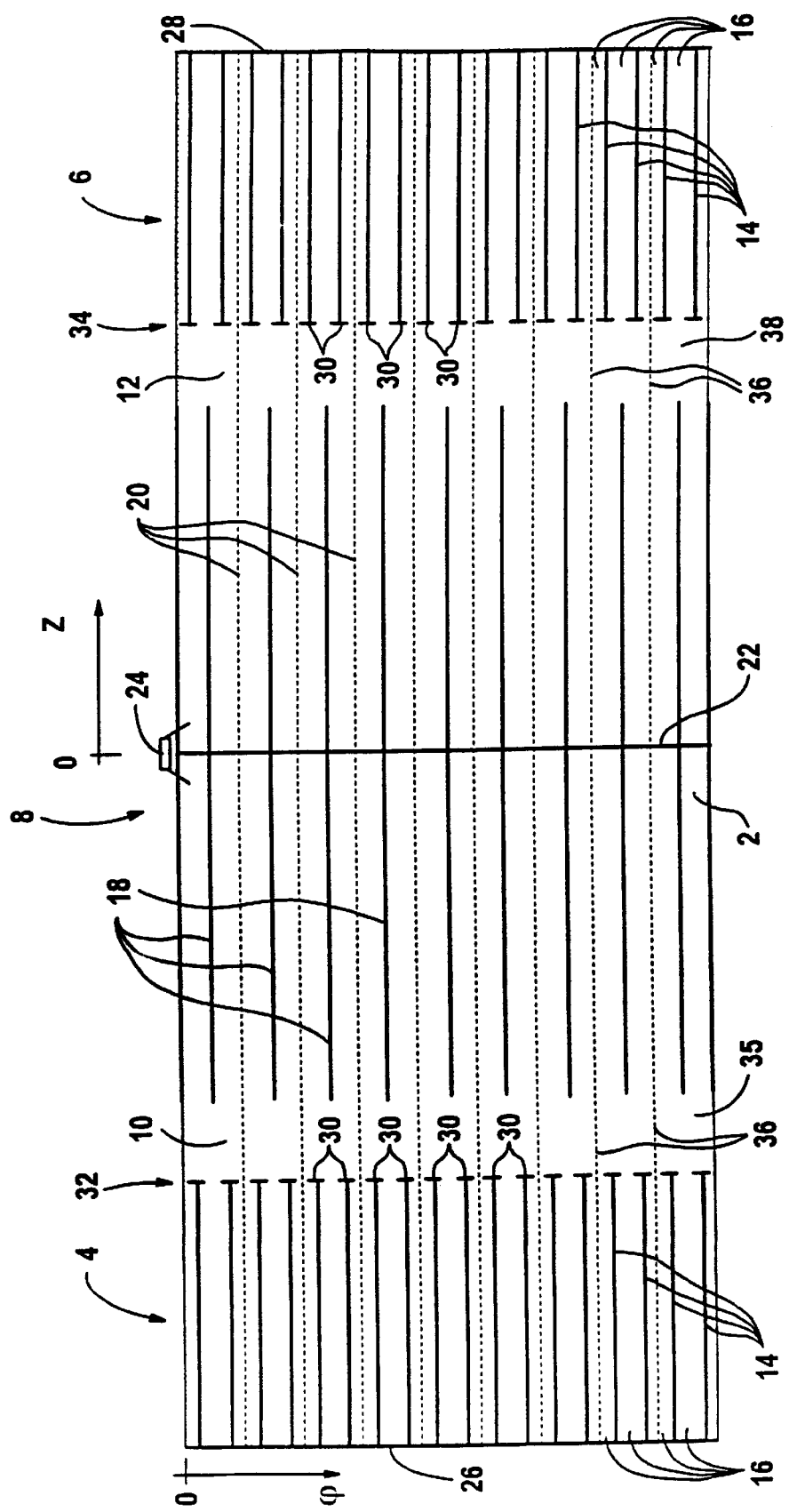
FIG. 1 is a plan view showing a developed view of the inside of a radio-frequency shield for a diagnostic magnetic resonance apparatus in accordance with the invention.

FIG. 1 shows a section of a first, structured, conductive coating 2 that is arranged at an inside of a hollow-cylindrical, dielectric carrier. The axial direction of the carrier is identified by the coordinate z and a circumferential direction is identified by a coordinate φ. The coating 2 is symmetrically fashioned with respect to a plane that proceeds perpendicular to the z-axis and through its zero point. The structure repeats in the circumferential direction φ.

The first coating 2 is slotted essentially only in the axial direction, whereby three regions are formed: slotted end regions 4 and 6 as well as a slotted middle region 8. The end regions 4 and 6 are separated from the middle region 8 by respective annular micro-strips 10 and 12 proceeding in the circumferential direction φ. The micro-strips 10, 12 each have a capacitively bridged interruption (not shown here) in order to avoid annular eddy currents.

Separating slots 14 that are axially aligned, i.e. aligned parallel to the z-axis, are worked into the end regions 4, 6, so that micro-strips 16 insulated from one another are formed in the region of the separating slots 14.

Axially aligned separating slots 18 are likewise introduced into the middle region 8, so that insulated micro-strips 20 are formed in the region of the separating slots 18. The spacing of the separating slots 14 in the circumferential direction φ is half as large as the corresponding spacing of the separating slots 18.

A through transverse slot 22 is introduced on the coating 2 in the circumferential direction φ in the symmetry plane. The transverse slot 22 is bridged by a high-impedance resistor 24 of approximately 100 kΩ at a location in order to prevent static charges.

The micro-strips 16 extend from the ends 26, 28 of the carrier toward the middle and respectively terminate in short transverse slots 30 that are respectively aligned along a circumferential line 32 and 34. The transverse slots 30 are not connected to one another.

The axial extent of the separating slots 18, including the annular micro-strips 10 and 12, is defined by the axial outside dimensions of the radio-frequency antenna. No conductor structures of the radio-frequency antenna, but only conductors of the gradient coils, are located in the slotted end regions 4 and 6.

In broken lines, FIG. 1 also shows a structure of a second electrically conductive coating 35 arranged on the outside of the carrier. The coating 35 has only axially aligned separating slots 36 that are interrupted in the symmetry plane, so that insulated strip lines 38 in the region of the separating slots 36 are galvanically connected to one another. Charging of the micro-strips 38 among one another are thus avoided.

Figure 2:
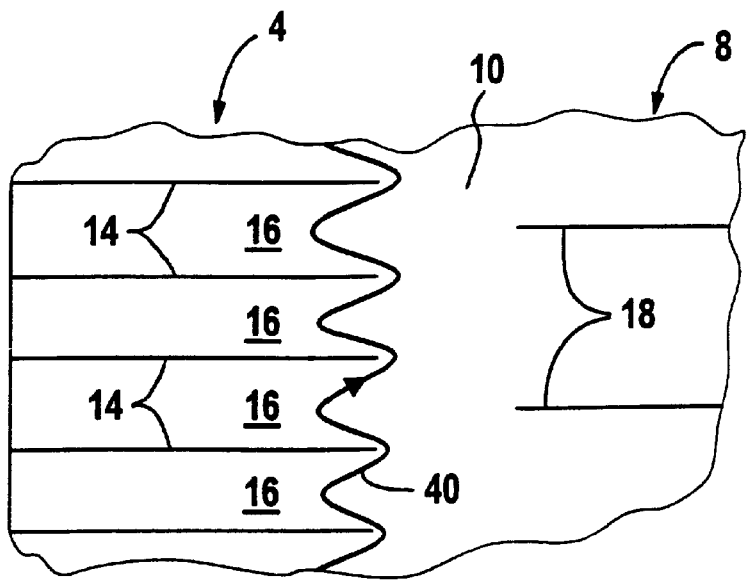
FIG. 2 is a plan view showing a developed view of a portion of a slotted end region without transverse slots.

The effect of the short transverse slots 30 on the eddy current paths shall be explained with reference to FIGS. 2 and 3. FIG. 2 shows an eddy current path 40 that would occur if the short transverse slots 30 were absent. The eddy current path 40 expands considerably into the micro-strip 16 in the axial direction. Due to the constrictions, high current densities that lead to a corresponding heating thus arise at the ends of the separating slots 14. Given a greater spacing of the separating slots 14 in the circumferential direction φ, the eddy currents penetrate even farther into the micro-strips 16.

Figure 3:
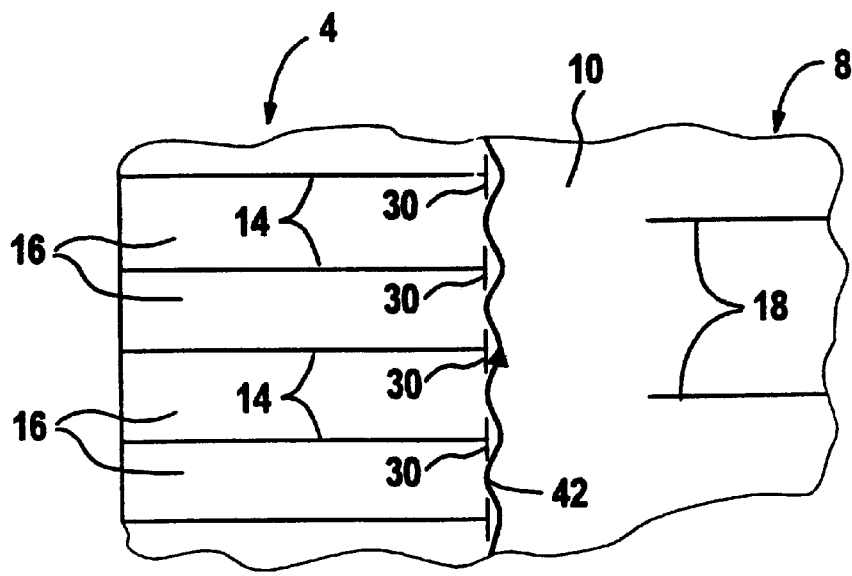
FIG. 3 is a plan view of a developed view of an end region with transverse slots in accordance with the invention.

With an eddy current path 42 entered therein, FIG. 3 shows how the eddy currents are prevented from penetrating into the micro-strips 16 in the axial direction by the short transverse slots 30 at the ends of the separating slots 14. Local elevations of current density and thus local heating in the end regions of the separating slots 14, are thus also prevented. The homogenizing effect on the course of the eddy current is intensified even more by the smaller spacing of the separating slots 14 in circumferential direction φ.

Figure 4:
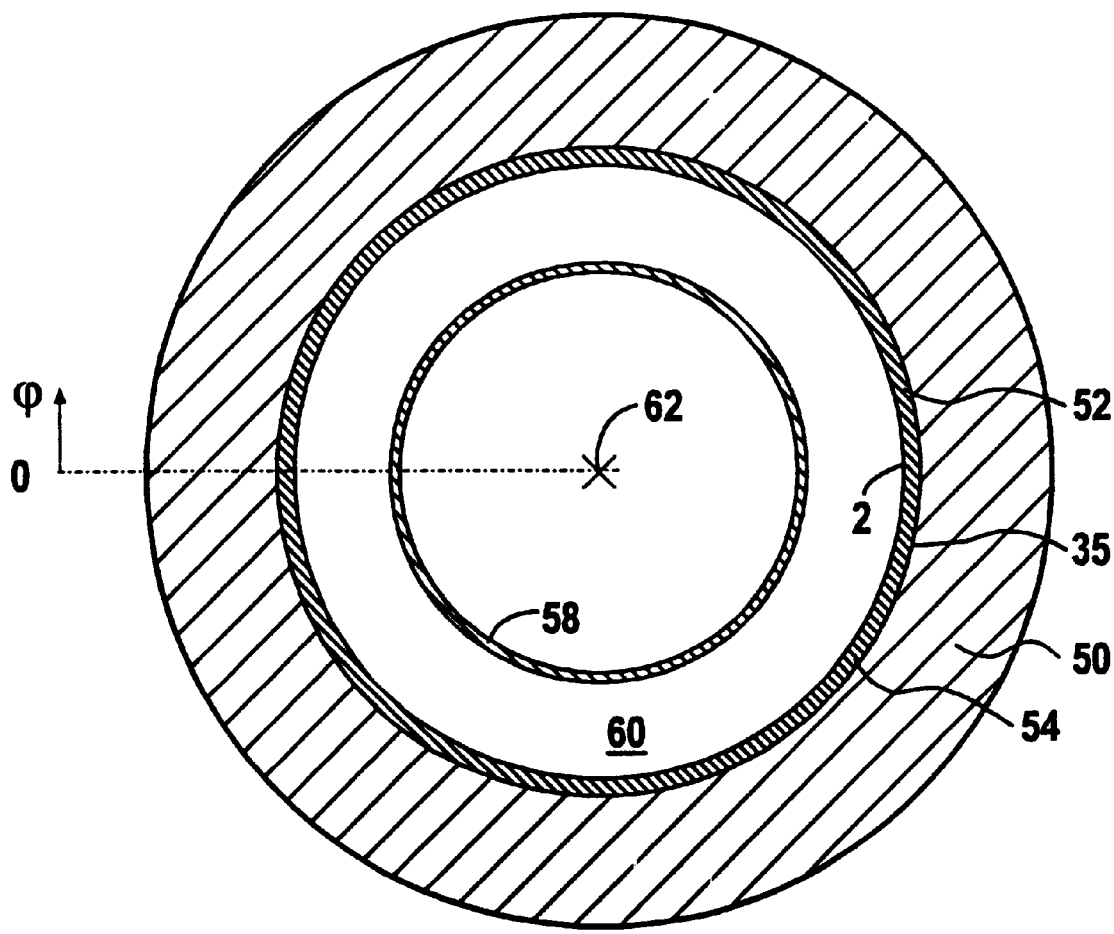
FIG. 4 shows a cross section through an arrangement of a radio-frequency antenna, of a radio-frequency shield in accordance with the invention and a gradient coil for a diagnostic magnetic resonance apparatus.

In cross section, FIG. 4 shows components of a diagnostic magnetic resonance apparatus that determine the structure of the radio-frequency shield. Here, the magnetic resonance apparatus is fashioned as whole body apparatus with an annular cryostat wherein superconducting coils are located for generating a uniform basic magnetic field. The individual components are arranged like the layers of an onion in the inside of the cryostat, with a gradient coil system 15 is arranged as the outer layer, this being integrated into the basic field magnet system (not shown here) as hollow-cylindrical structural unit. The radio-frequency shield 52 already explained with reference to FIGS. 1 through 3 is arranged within the gradient coil system 50, this being laminated to the inside of the gradient coil system 50 for eliminating heat. A good, conductive connection of the radio-frequency shield 52 with the already-cooled gradient coil system 50 is thus created. The radio-frequency shield 52 is composed of a circular, hollow-cylindrical carrier 54 on which the coating 2 is arranged at the inside and the coating 35 is arranged at the outside. A standard dielectric as commercially obtainable, for example, the type designated as FR4, is employed as the carrier 54. The thickness of the dielectric amounts, for example, to 75 μm.

The coatings 2, 35 are applied on the carrier 54 as copper layers each having a thickness that approximately corresponds to triple the penetration depth of the radio-frequency current. The separating slots can be introduced into the coatings 2, 35 with an etching process of the type known from printed circuit board manufacture.

Finally, a radio-frequency antenna arrangement 58 is present as the innermost layer, this being arranged as a hollow-cylindrical component having a spacing 60 from the radio-frequency shield 52. All components 50, 52, 58 are arranged coaxially relative to a symmetry axis 62 in the basic field magnet system. The symmetry axis 62 also defines the position of the z-coordinate. The circumferential coordinate 5 is likewise entered.

Although modifications and changes may be suggested by those skilled in the art, it is the intention of the inventors to embody within the patent warranted hereon all changes and modifications as reasonably and properly come within the scope of their contribution to the art.

We claim as our invention:

1. A radio-frequency shield for a diagnostic magnetic resonance apparatus, said radio-frequency shield comprising:

a hollow, cylindrical carrier composed of dielectric material and having an interior surface and an exterior surface and opposite ends with a longitudinal axis proceeding between said opposite ends;

a first electrically conductive coating covering said interior of said carrier and having respective end regions at said ends of said carrier and a middle region therebetween, said first electrically conductive coating having a first plurality of separating slots therein substantially aligned with said longitudinal axis, said first plurality of separating slots including slots disposed in each of said end regions and slots disposed in said middle region, each of said slots in each of said end regions terminating, at an axial distance from a closer end of said carrier, in a transverse slot; and a second electrically conductive coating covering said exterior of said carrier and having a second plurality of separating slots therein, said separating slots in said second plurality being circumferentially offset from said separating slots in said first plurality.

2. A radio-frequency shield as claimed in claim 1 wherein said carrier has an annular cross-section.

3. A radio-frequency shield as claimed in claim 1 wherein said first electrically conductive coating further comprises a continuous transverse slot therein proceeding circumferentially around a middle of said middle region, and a resistor bridging portions of said middle region on opposite sides of said continuous transverse slot.

4. A radio-frequency shield as claimed in claim 1 wherein said separating slots in said middle region of said first electrically conductive coating are circumferentially spaced from each other at a first circumferential spacing, and wherein said separating slots in each of said end regions of said first electrically conductive coating are circumferentially spaced from each other at a second circumferential spacing, said first circumferential spacing being larger than said second circumferential spacing.

* * * * *